US012754230B2

(12) United States Patent
Cunningham et al.

(10) Patent No.: US 12,754,230 B2
(45) Date of Patent: Oct. 6, 2026

(54) TESTING A CIRCUIT BOARD

(71) Applicant: Teradyne, Inc., North Reading, MA (US)

(72) Inventors: Timothy Cunningham, Huntsville, AL (US); Anthony Suto, Sterling, MA (US); Daniel Harari, Waltham, MA (US); Aidan Pulaski, Swampscott, MA (US)

(73) Assignee: Teradyne, Inc., North Reading, MA (US)

( * ) Notice: Subject to any disclaimer, the term of this patent is extended or adjusted under 35 U.S.C. 154(b) by 99 days.

(21) Appl. No.: 18/660,003

(22) Filed: May 9, 2024

(65) Prior Publication Data

US 2025/0347734 A1 Nov. 13, 2025

(51) Int. Cl.
*G01R 31/28* (2006.01)

(52) U.S. Cl.
CPC ..... *G01R 31/2812* (2013.01); *G01R 31/2806* (2013.01); *G01R 31/2818* (2013.01)

(58) Field of Classification Search
CPC ... G01R 31/002; G01R 31/2812; G01R 31/70
See application file for complete search history.

(56) References Cited

U.S. PATENT DOCUMENTS 4,517,511 A 5/1985 Suto
5,103,109 A 4/1992 Khazam et al.
6,114,848 A 9/2000 Suto et al.
6,175,230 B1 1/2001 Hamblin et al.
2003/0229091 A1 12/2003 Termin et al.
2006/0028459 A1* 2/2006 Underwood ............ G06F 3/013 345/179
2010/0207651 A1 8/2010 Suto
2011/0148446 A1 6/2011 Suto
2011/0148450 A1 6/2011 Suto
2011/0204910 A1 8/2011 Suto (Continued)

OTHER PUBLICATIONS

"Flying Probe Testing 101", Matric Group, Dec. 2023, 8 pages.

(Continued)

*Primary Examiner* — Huy Q Phan
*Assistant Examiner* — Temilade S Rhodes-Vivour
(74) *Attorney, Agent, or Firm* — ARENTFOX SCHIFF LLP

(57) ABSTRACT

An example system is configured to test an electrical connection in a circuit board. The circuit board includes a first electrically-conductive structure for receiving test signals, second electrically-conductive structures for mounting components, and electrically-conductive traces between the first electrically-conductive structure and the second electrically-conductive structures. The system includes a pin assembly including an electrically-conductive pin that is configured to physically contact the first electrically-conductive structure to apply an electrical signal to the first electrically-conductive structure; and a sensor configured to wirelessly couple to a second electrically-conductive structure. The sensor is configured to receive, through the wireless coupling, an electrical response that is based on the electrical signal through an electrically-conductive trace on the circuit board.

29 Claims, 8 Drawing Sheets

(56) References Cited

U.S. PATENT DOCUMENTS

| | | | | |
|---|---|---|---|---|
| 2011/0210759 | A1 | 9/2011 | Suto | |
| 2012/0225366 | A1 | 9/2012 | Suto et al. | |
| 2013/0015870 | A1* | 1/2013 | Nickel | G01R 1/06772 324/754.03 |
| 2013/0038466 | A1* | 2/2013 | Shen | G08C 19/00 340/870.02 |
| 2014/0306728 | A1 | 10/2014 | Arena et al. | |
| 2016/0054385 | A1 | 2/2016 | Suto | |
| 2016/0172310 | A1* | 6/2016 | Zhai | H10W 42/20 257/659 |
| 2017/0143311 | A1* | 5/2017 | Srinivasan | A61B 8/065 |
| 2017/0176494 | A1* | 6/2017 | Hiew | G01R 31/2886 |
| 2017/0292873 | A1 | 10/2017 | Schleicher et al. | |
| 2018/0095109 | A1 | 4/2018 | Suto et al. | |
| 2019/0140032 | A1 | 5/2019 | Messier et al. | |
| 2020/0088785 | A1 | 3/2020 | Suto et al. | |

OTHER PUBLICATIONS

“Flying probe”, Wikipedia, 2024, 2 pages.

“How flying probe testing works for PCB assembly”, Sierra Circuits, 2020, pp. 1-16.

“Z1800-Series MultiScan User’s Guide”, Teradyne Inc., Third Edition, Aug. 1998, 124 pages.

* cited by examiner

TESTING A CIRCUIT BOARD

TECHNICAL FIELD

This specification describes example implementations of techniques for testing a circuit board.

BACKGROUND

A test system is configured to test the operation of a device. A device tested by a test system is referred to as a device under test (DUT). An example of a type of DUT that may be tested using a test system includes a circuit board such as a printed circuit board (PCB). An example circuit board includes conductive traces through its interior and/or on its surface. Devices, such as electronic components, may be mounted to conductive structures, called pads, on and/or in the circuit board to electrically connect to and through those conductive traces.

SUMMARY

An example system is configured to test an electrical connection in a circuit board. The circuit board includes a first electrically-conductive structure for receiving test signals, second electrically-conductive structures for mounting components, and electrically-conductive traces between the first electrically-conductive structure and the second electrically-conductive structures. The system includes a pin assembly including an electrically-conductive pin that is configured to physically contact the first electrically-conductive structure to apply an electrical signal to the first electrically-conductive structure; and a sensor configured to wirelessly couple to a second electrically-conductive structure. The sensor is configured to receive, through the wireless coupling, an electrical response that is based on the electrical signal through an electrically-conductive trace on the circuit board. The system may include one or more of the following features, either alone or in combination.

The sensor may be electromagnetically shielded. The system may include a sensor package. The sensor package may include the sensor and an amplifier. The amplifier may be configured to amplify a signal that is based on the electrical response. The sensor package may be electromagnetically shielded. The pin assembly may include electromagnetic shielding to electromagnetically shield the electrically-conductive pin. The pin assembly may include an outer enclosure. The outer enclosure may include an electrically-insulating ring. The outer enclosure may be configured to move relative to the electrically-conductive pin so that the outer enclosure encloses the electrically-conductive pin when the electrically-conductive pin is in physical contact with the first electrically-conductive structure. The outer enclosure may be or include metal. The outer enclosure may be spring-loaded to move relative to the electrically-conductive pin. The outer enclosure may be configured at least to inhibit signal coupling between the electrically-conductive pin and the sensor.

The electrical response may be received from the second electrically-conductive structure. The electrically-conductive trace may be internal to the circuit board or on a surface of the circuit board. The sensor may include an electrical insulator that surrounds at least part of the sensor. The system may include circuitry configured to receive a signal based on the electrical response from the sensor and to amplify the signal based on the electrical response to produce an amplified electrical signal.

The system may include a detector configured to compare a signal based on the amplified electrical signal to a first threshold to test an electrical path including the electrically-conductive trace. If the signal based on the amplified electrical signal exceeds the first threshold, then the one or more processing devices may determine that the electrical path including the electrically-conductive trace has passed testing. The detector may be configured also to compare the signal based on the amplified electrical signal to a second threshold. The second threshold may be greater than the first threshold. If the signal based on the amplified electrical signal exceeds the first threshold but not the second threshold, then the system may determine that the electrical path including the electrically-conductive trace has passed testing. If the signal based on the amplified electrical signal exceeds the second threshold, then the system may determine that there is a short circuit to a second electrically-conductive structure.

The circuit board may include multiple instances of the first electrically-conductive structure and multiple sets of second electrically-conductive structures. Each set of second electrically-conductive structures may be electrically connected to a respective instance of the first electrically-conductive structure through electrically-conductive traces. The system may include multiple instances of the sensor. Each instance of the sensor may be configured to wirelessly couple to a second electrically-conductive structure in a different set of the second electrically-conductive structures. The system may include a multiplexer to select an output of one of the instances of the sensor and a detector to receive a signal that is based on the output of the one of the instances of the sensor and to test an electrical path based on the signal.

The system may include a fixture containing the electrically-conductive pin and the sensor. The fixture may be configured for placement relative to the circuit board so that the electrically-conductive pin aligns to the first electrically-conductive structure and the sensor aligns to multiple instances of the second electrically-conductive structures. Alignment of the electrically-conductive pin to the first electrically-conductive structure and of the sensor to the multiple ones of the second electrically-conductive structures may be based on coordinate locations of the first electrically-conductive structure and the multiple instances of the second electrically-conductive structure.

The second electrically-conductive structure may be internal to the circuit board. The second electrically-conductive structure may be on a surface of the circuit board. The second electrically-conductive structure may include a component structure, a via structure, a test structure, an electrical routing trace, an inner layer trace, or a metal surface area internal or external to the circuit board.

An example method is for testing electrical connections in a circuit board. The circuit board includes a first electrically-conductive structure for receiving test signals, second electrically-conductive structures for mounting components, and electrically-conductive traces between the first electrically-conductive structure and the second electrically-conductive structures. The method includes causing an electrically-conductive pin to physically contact the first electrically-conductive structure; wirelessly coupling a sensor to a second electrically-conductive structure; applying an electrical signal to the first electrically-conductive structure; and receiving, at the sensor through the wireless coupling, an electrical response that is based on the electrical signal through an electrically-conductive trace on the circuit board between the first electrically-conductive structure and the second electrically-conductive structure. The example method may include one or more of the following features, either alone or in combination.

The method may include selecting an output of the sensor that is based on the electrical response; processing the output to produce a signal that is based on the electrical response; and comparing the signal that is based on the electrical response to a first threshold. The method may include comparing the signal that is based on the electrical response to a second threshold. If the signal exceeds the first threshold but not the second threshold, then an electrical path including the electrically-conductive trace may pass testing. If the signal exceeds the second threshold, then it may be determined that there is a short circuit to a second electrically-conductive structure. Processing the output may include amplifying a precursor signal to the signal that is based on the electrical response. Causing the electrically-conductive pin to physically contact the first electrically-conductive structure may result in at least partly electromagnetically shielding the electrically-conductive pin. Causing the electrically-conductive pin to physically contact the first electrically-conductive structure and wirelessly coupling may include bringing a fixture that includes the electrically-conductive pin and the sensor into at least partial contact with the circuit board. Bringing the fixture into at least partial contact may be based on coordinates associated with at least one of the fixture or the circuit board. At least one of the electrically-conductive pin or the sensor may be electromagnetically shielded.

Any two or more of the features described in this specification, including in this summary section, may be combined to form implementations not specifically described in this specification.

At least part of the devices, systems, circuits, and processes described in this specification may be configured or controlled by executing, on one or more processing devices, instructions that are stored on one or more non-transitory machine-readable storage media. Examples of non-transitory machine-readable storage media include read-only memory, an optical disk drive, memory disk drive, and random access memory. At least part of the devices, systems, circuits, and processes described in this specification may be configured or controlled using a computing system comprised of one or more processing devices and memory storing instructions that are executable by the one or more processing devices to perform various control operations. The devices, systems, circuits, and processes described in this specification may be configured, for example, through design, construction, composition, arrangement, placement, programming, operation, activation, deactivation, and/or control.

The details of one or more implementations are set forth in the accompanying drawings and the following description. Other features and advantages will be apparent from the description and drawings, and from the claims.

DESCRIPTION OF THE DRAWINGS

Like reference numerals in different figures indicate like elements.

DETAILED DESCRIPTION

Figure 1:
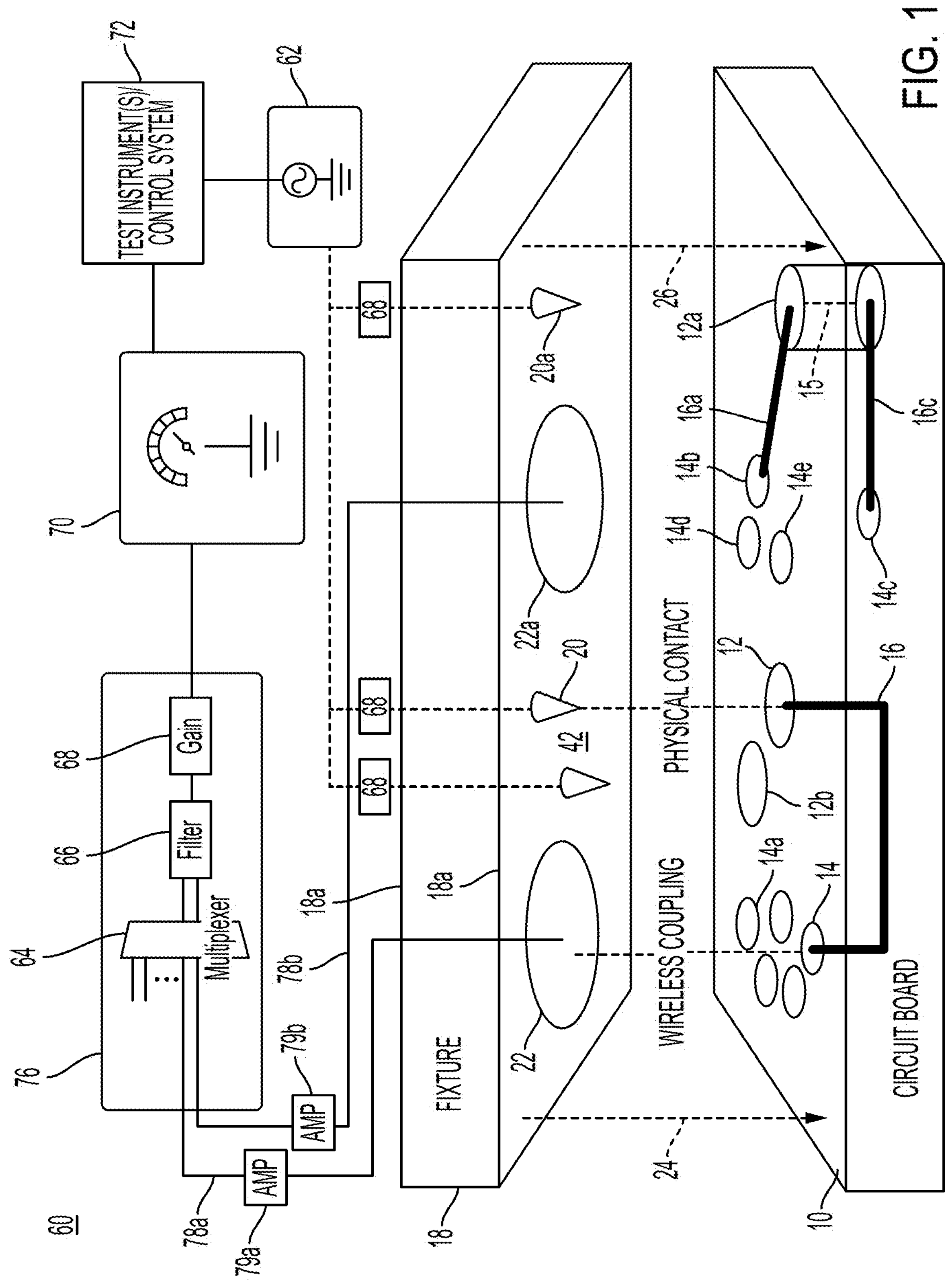
FIG. 1 is block diagram of an example fixture and circuitry for testing electrical paths on and/or through a circuit board.

Described herein are examples of systems and processes for testing circuit boards, such as printed circuit boards (PCBs). A circuit board being tested may be referred to as a device under test (DUT). The systems and processes may be used to test electrical paths of a circuit board including electrically-conductive (or simply, "conductive") traces of a circuit board. In some implementations, a circuit board may contain layers of conductive material and non-conductive substrate. The conductive traces that are being subjected to testing may be part of these layers of conductive material. The conductive traces may be internal to the circuit board and/or on one or more surfaces of the circuit board. The conductive traces may include connections between conductive layers, such as conductive vias, and other conductive structures that are native to the circuit board. In some examples, a structure is native to a circuit board if the structure is part of—for example, a constituent component of—the circuit board present at the time the circuit board is manufactured, as opposed to a component that is mounted on the circuit board post-manufacture.

A circuit board may be configured for component mounting. For example, the circuit board may contain conductive pads on one or more of its surfaces, to which electronics components, may be mounted. The electronic components may include active electronic components, such as microprocessors or programmable logic, or passive electronic components, such as resistors and capacitors. The example systems and processes described herein may be used to electrical paths and/or conductive traces of the circuit board without such components mounted on the circuit board. In some implementations, the systems and processes may be used to test electrical paths and/or conductive traces of a circuit board, where the circuit board contains no electronic components mounted to the circuit board. In some implementations, the systems and processes may be used to test electrical paths and/or conductive traces of a circuit board, where the circuit board contains electronic components mounted to the circuit board. In some implementations, the systems and processes may be used to electrical paths and/or conductive traces of a circuit board to which no electronic components mounted on the circuit board are electrically connected. For example, the circuit board may contain one or more electronic components mounted thereon, but the systems and processes may test electrical paths and/or conductive traces that are not electrically connected to those mounted components. In some implementations, the systems and processes may be used to test electrical paths and/or conductive traces of a circuit board that is fully populated with electronic components. In such a circuit board, the circuit board includes all components that are required for operation. The systems and processes may be used to test internal conductive traces and/or electrical paths, such as internal antennas.

The example of systems and processes test electrical paths and/or conductive traces by applying an electrical signal to a first conductive pad connected to a first end the conductive trace and monitoring a second conductive pad connected to a second end of the conductive trace using a sensor to detect a signal. The detected signal, if any, is compared to one or more predefined thresholds to determine whether the signal is of an expected strength and, therefore, whether the electrical paths and/or conductive traces has passed testing.

FIG. 1 shows an example of at least part of a circuit board 10 to be tested. In this example, circuit board 10 contains no electronic components connected to its conductive pads. Conductive pad 12 is referred to as a test pad 12, since this is the conductive pad where an electrical signal is applied to the circuit board to test an electrical path through the circuit board. Other example test pads are labeled 12*a* and 12*b*, although more may than two other test pads may be present. Conductive pad 14 is referred to as sensor pad 14, since this is a conductive pad that is monitored by a sensor. Other example sensor pads are labeled 14*a* and 14*b*, although more than two other sensor pads may be present. Conductive trace 16 electrically connects test pad 12 and sensor pad 14. The other conductive traces shown in FIG. 1 are labeled 16*a* and 16*c*, although more than three conductive traces may be present in the circuit board.

The system and processes described herein may test electrical paths through the circuit board, such as the electrical path including test pad 12, conductive trace 16, and sensor pad 14. Inner layer traces, such as conductive trace 16*c*, may be part of embedded antennas on the circuit board. The antennas may be a section of metal material and include a component pad geometry 14*c* on an internal layer of the circuit board. Thus, fully internal layers—such as conductive trace or layer 16*c*, which does not have a component pad on a surface of the circuit board—can be sensed by the sensor and tested by the system described herein. A component of the circuit board to be tested may be, or be on, any layer of the circuit board regardless of whether that layer has a sensor pad on a surface of the circuit board. A control system, for example, knows the locations of such inner layers and sensor pads to enable testing thereof.

In some implementations, a sensor pad is a conductive structure that may be or include a component pad, a via pad, a test pad, an electrical routing trace or inner layer trace or metal surface area internal or external to the circuit board layer stack-up. In some implementations, external pads or trace routing metal may be covered with a solder resist layer. The sensor may still work in this case since the sensor does not need to have contact with metal on the circuit board. In some implementations, a test pad is a conductive structure that may be or include a component pad, a via pad, a sensor pad, an electrical routing trace or inner layer trace or metal surface area internal or external to the circuit board layer stack-up. In some implementations, any sensor pad can be a test pad. In some implementations, any test pad can be a sensor pad. In some implementations, the test pads are larger than the sensor pads. For example, the test pads may have two times, five times, ten times, fifty times, or one hundred times the surface area of a sensor pad.

Figure 2:
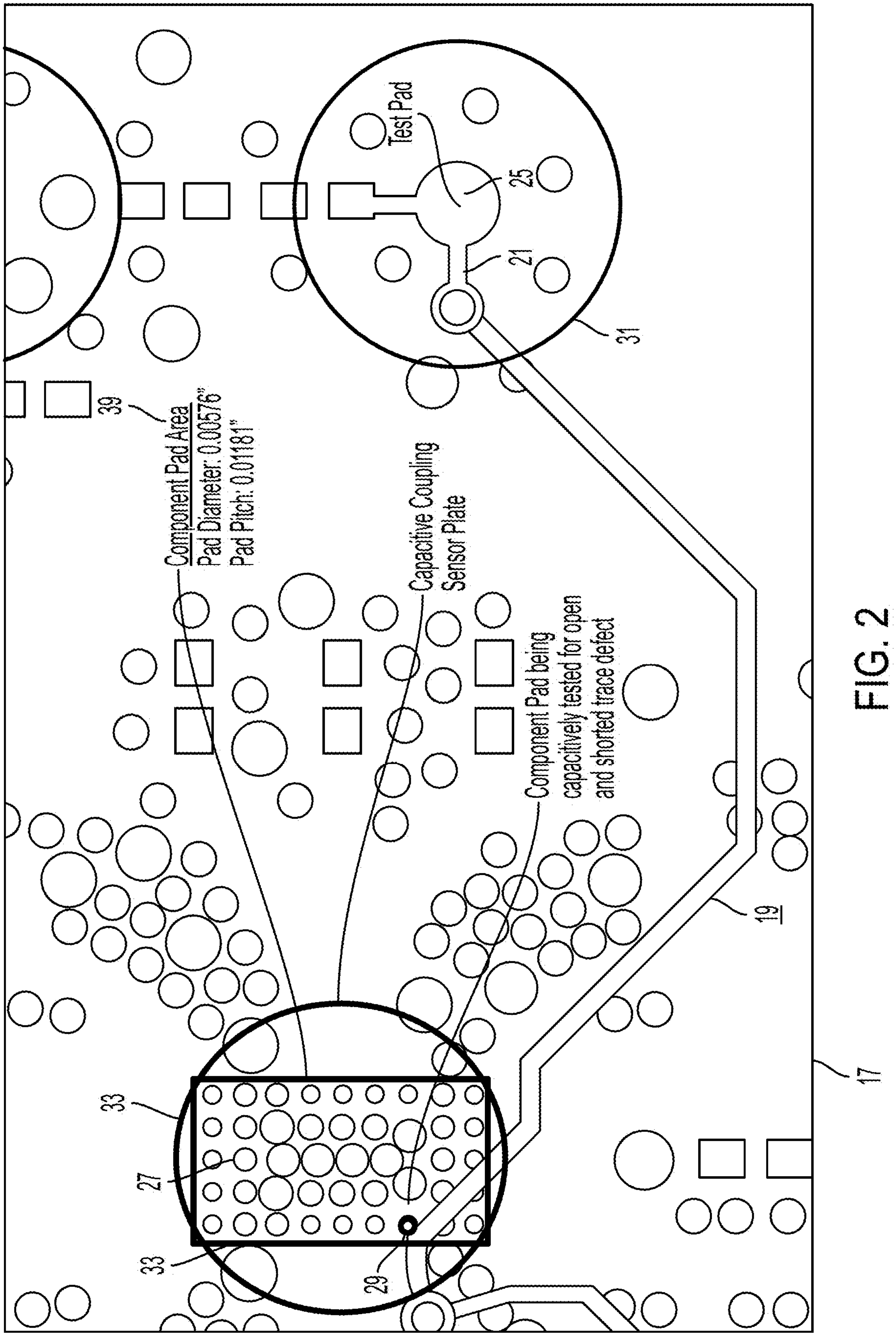
FIG. 2 shows a top, partially transparent, view of at least a portion of an example circuit board under test that includes test pads, conductive traces, and sensor pads.

FIG. 2 shows a top, partially transparent, view of at least a portion of another example circuit board 17 that includes test pads, conductive traces, and sensor pads like those of FIG. 1 and that may be tested using the systems and processes described herein. Conductive trace 19 includes an inner portion 21, which is embedded in the circuit board—for example, among circuit board substrate layers—and a surface portion 23, which is on a surface of the circuit board. Test pad 25 is shown electrically connected to conductive trace 19. Sensor pads 27 include sensor pad 29 that is electrically connected to conductive trace 19. Circle 31 represents the location of contact with a pin assembly (described below) and circle 33 represents an area containing multiple sensor pads that a single sensor (described below) covers. Rectangle 36 represents an area of component pads to which components may be mounted on the circuit board, and which may be covered by a single sensor. The component pads are sensor pads 27 in the context of this disclosure, since conductive traces to and/or from the component pads may be tested using the techniques described herein. The component pad area dimensions 39 shown are in inches and are examples only. Any dimensions may be used for the component pad area.

Referring back to FIG. 1, FIG. 1 also shows example of a fixture 18 (or "probe board") that may be included in the systems described herein and may be used to perform the testing processes described herein. Fixture 18 includes one or more pin assemblies 20 and one or more sensors 22, examples of which are described in detail below. Fixture 18 is configured—for example, designed—so that pin assemblies align to test pads of the circuit board to which electrical signals are to be applied for testing and so that sensors align to sensor pads of the circuit board that are being monitored for responses to the applied electrical signals. A fixture may be designed so that coordinates, such as Cartesian X, Y coordinates, of the fixture map to corresponding coordinates, such as Cartesian X, Y coordinates. of a circuit board under test. That way, the locations of pins and sensors on the fixture may map to locations of the test pads and sensor pads, respectively, on the circuit board. A configuration such as this may facilitate placement of fixture 18 relative to circuit board 10.

In some implementations, fixture 18 may have a surface area that is equal to or greater than a surface area of circuit board 10 to be tested. As a result, all or some testing may be performed without moving the fixture relative to the circuit board. In some implementations, fixture 18 may have a surface area that is less than a surface area of circuit board to be tested. In these examples, fixture 18 may be moved relative to the circuit board during testing so that the pin assemblies and sensors align to different conductive pads on the circuit board during different stages of the testing.

To test circuit board 10, fixture 18 is brought into proximity of circuit board 10 through movement in the directions of arrows 24, 26 so that, for example, pin assembly 20 and sensor 22 align to corresponding conductive pads 12 and 14 of circuit board 10. Other pin assemblies, such as pin assembly 20*a* and sensor 22*a* also align to corresponding conductive pads of the circuit board as a result of the movement. Alignment in this context may include at least being over or covering the corresponding conductive pad. Pin(s), described below, that are part of the pin assemblies make physical and electrical contact with their counterpart test pads, whereas the sensors(s) are in proximity to, but do not physically contact, their counterpart sensor pads in some implementations. In some implementations, the distance between the sensors(s) and their counterpart sensor pads may be on the order of single-digit millimeters, double-digit millimeters, or single-digit centimeters.

Figure 3:
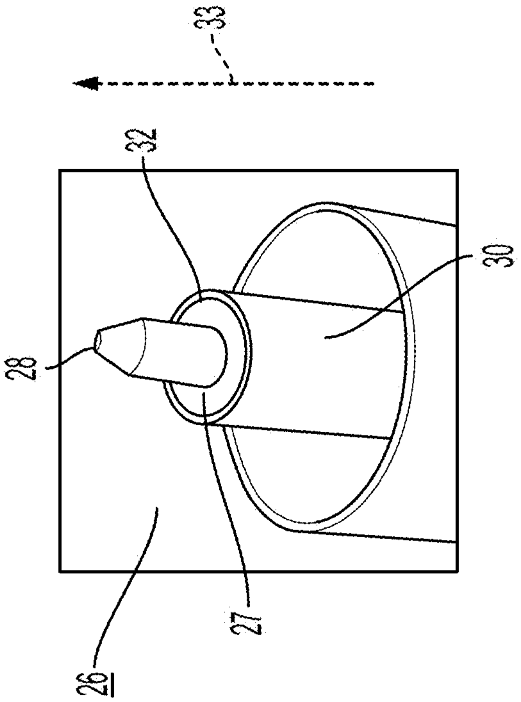
FIG. 3 is an image of a top perspective view of part of an example pin assembly.

An example of a pin assembly, such as pin assembly 20 or 20*a*, is pin assembly 26 of FIG. 3. In some implementations, each pin assembly of fixture 18 may have the same structure and function as pin assembly 26 of FIG. 3. Pin assembly 26 includes a conductive pin, such as pin 28. Pin 28 may be made of one or more electrically-conductive materials, examples of which include metals such as copper and/or aluminum. Pin 28 is configured to physically contact a test pad on a circuit board such as test pad 12 of FIG. 1, thereby creating an electrical connection between pin 28 and test pad 12. An electrical signal may be applied to test pad 12 through pin 28. The electrical signal may be used to test one or more electrical paths of the circuit board, such as an electrical path including test pad 12, conductive trace 16, and sensor pad 14. The electrical signal may be or include an alternating current (AC) electrical signal. The electrical signal may be or include a direct current (DC) electrical signal.

As shown in FIG. 3, example pin assembly 26 includes an outer enclosure 30 that is conductive. In this example, pin assembly 26 is a coaxial cable, with pin 28 completely surrounded by a dielectric 27, which is completely surrounded by outer enclosure 30. In some implementations, the pin assembly includes a conductive pin partially surrounded by a dielectric, which is partially surrounded by an outer enclosure. Outer enclosure 30 electromagnetically shields pin 28, including in the configuration of FIG. 6 below, thereby inhibiting, reducing, and/or preventing unwanted wireless electrical signal coupling between pin 28 and other electrically conductive structures such as, but not limited to, sensors such as sensors 22 and 22*a* of FIG. 1, other conductive pads of the circuit board that pin 28 is not in contact with, conductive traces of the circuit board, and/or other conductive structures on fixture 18.

Figure 6:
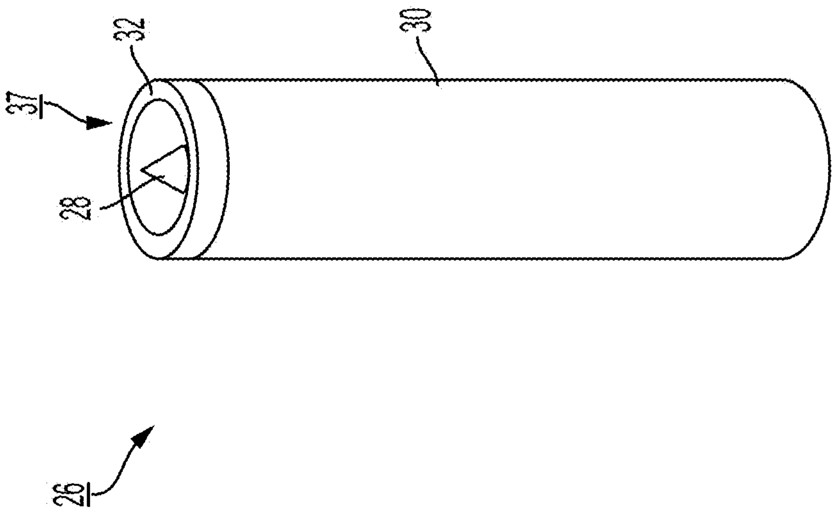
FIG. 6 is a top perspective view of part of an example pin assembly having an outer enclosure thereof enclosing a pin thereof but leaving an open end for connection.

At least part of outer enclosure 30 may be configured to move relative to pin 28 so that pin 28 is exposed when the pin is not in physical contact with a test pad of the circuit board and so that outer enclosure 30 completely, partially, or at least partially encloses pin 28 when the pin is in physical contact with the test pad of the circuit board. For example, pin 28 or part of outer enclosure 30 may be spring-loaded such that pressure applied to the pin assembly in the direction of arrow 33 causes relative movement between pin 28 and outer enclosure 30. This relative movement enables pin 28 to contact the test pad and outer enclosure to move over pin 28, thereby causing outer enclosure to completely, partially, or at least partially enclose pin 28, as shown in FIG. 6. This complete, partial, or at least partial enclosure leaves an open end 37 that enables pin 28 to contact a test pad. By outer enclosure 30 completely, partially, or at least partially enclosing pin 28, outer enclosure 30 electromagnetically shields pin 28, which inhibits, reduces, and/or prevents wireless electrical signal coupling between pin 28 and other electrically conductive structures such as, but not limited to the sensors, other conductive pads of the circuit board, conductive traces of the circuit board, and conductive structures on fixture 18.

In this regard, wireless electrical signal coupling may include capacitive or electrostatic coupling. Unwanted wireless coupling can interfere with test results. Therefore, it may be beneficial to inhibit, to reduce, or to prevent unwanted wireless signal coupling as described above.

As shown in FIGS. 3 and 6, outer enclosure 30 may include an insulating ring 32, which may be made of electrically-insulating (non-conductive) materials such as one or more of polyethylene, plastic, rubber, and/or a fluoropolymer. Insulating ring 32 may be at the end of outer enclosure 30 proximate to pin 28 and may be pliable so that it conforms to the surface of circuit board 10 when it comes into contact with the surface of circuit board 10, thereby providing a seal to the surface. Such a seal may prevent physical and electrical contact between the conductive outer enclosure 30 and conductive structures, such as conductive pads and conductive traces, on the circuit board, thereby reducing the chances of unwanted short circuits during testing. Such a seal may also support the electrical or other isolation provided by outer enclosure 30

Figure 7:
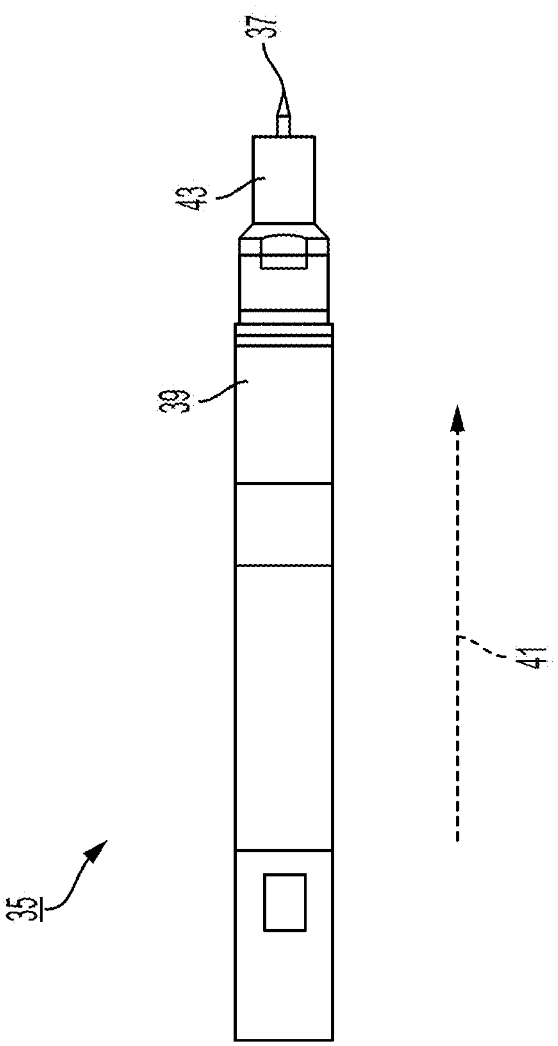
FIG. 7 is a side view of part of an example pin assembly.

FIG. 7 shows another example implementation of a pin assembly, such as pin assembly 20 or 20*a*, which is labeled 35. Pin assembly 35 includes outer enclosure 39, dielectric 43, and pin 37 configured to contact a test pad. Outer enclosure 39 moves relative to pin 37, or pin 37 moves relative to outer enclosure 39 as described herein. Accordingly, when pressure is applied to pin assembly 35 in the direction of arrow 41, outer assembly 39, completely, partially, or at least partially encloses pin 37 in a similar manner to that shown in FIG. 6, leaving an open end for connection to the test pad.

Figure 4:
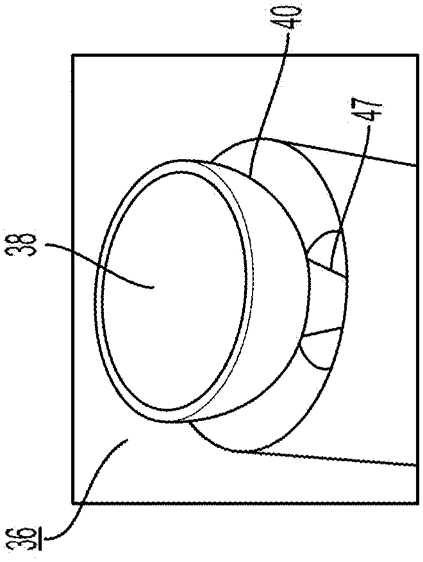
FIG. 4 is an image of a top perspective view of part of an example sensor.

Referring to FIGS. 1 and 4, an example implementation of a sensor, such as sensor 22 or 22*a*, is sensor 36 of FIG. 4. Each sensor of fixture 18 may have the same structure and function as sensor 36. Sensor 36 may be made of one or more electrically-conductive materials, examples of which include metals such as copper and/or aluminum. Sensor 36 may have a circular perimeter and a flat, substantially flat, or curved surface 36 configured to face sensor pad. Substantially flat may include surfaces that deviate from flat by 5% or less, 10% or less, 20% or less, or 25% or less, for example. In some implementations, sensor 36 may have a different perimeter shape than circular, such as oval, square, rectangular, or irregular shape. In some implementations, surface 38 may have a different shape; for example, surface 38 may have an irregular shape. In this regard, each sensor may be round, square, rectangular, or any other shape that can be positioned over or directly over conductive structures such as component pads/via's/traces being sensed through wireless coupling. In some implementations, surface 38 has a surface area that covers—for example, extends above or over but does not touch—multiple sensor pads 14, 14*a*, etc. of the circuit board. For example, surface 38 of sensor 36 may cover one, two, five, ten, fifteen, twenty, fifty, one hundred, or more sensor pads. In an example implementation, sensor 36 has a surface 38 that covers thirty-five sensor pads.

In an example, surface 38 of sensor 36 may be 100 mils (2.54 millimeters (mm)) in diameter to 124 mils (3.15 mm) in diameter. In this same example, individual sensor pads may be about 5.75 mils (0.15 mm) in diameter and may be arranged at a pitch of 11.8 mils (0.3 mm), where pitch refers to the distance between centers of sensor pads. Other implementations of the fixture and circuit board may have different dimensions than these for the surface, the sensor pads, and the pitch.

In some implementations, sensor 36 includes an electrical insulator, such as shroud 40, that surrounds, in whole or in part, an exterior of sensor 36, and that covers the exterior surface of sensor 36 excluding the surface 38 of sensor that faces the circuit board. For example shroud 40 may extend over an entirety of sensor 36 except for a surface 38 of sensor 36 that wirelessly couples to sensor pads on the circuit board. In some implementations, shroud 40 may be made of any one or more of the electrically insulating materials described herein. Shroud 40 may act as a dielectric in a coaxial-type electromagnetic shield of the sensor that is configured to inhibit, to reduce, and/or to prevent unwanted wireless electrical signal coupling between sensor 36 and other electrically conductive structures such as, but not limited to, pins or pin assemblies, other conductive pads of the circuit board, conductive traces of the circuit board, and other conductive structures on the fixture.

Shroud 40 may extend above, or extend outward from, surface 38 of sensor 36 relative to a surface 42 of (e.g., towards) fixture 10. Thus, shroud 40 may reduce the chances that surface 38 of sensor 36, which is conductive, contacts a conductive pad or other conductive structure of circuit board 10. For example, due to the extension of shroud 40 above or from surface 38 of sensor 36, if there is contact between part of sensor 36 and a conductive pad of circuit board 10, that contact would, in most instances, be with shroud 40, which is an electrical insulator, and not with the conductive surface 38 of sensor 36.

Sensor 36 also includes a conduit, such as a coaxial conduit 47, for transmitting electrical signals resulting from the wireless coupling. Conduits other than coaxial may be used, such as twisted pair wires, conductive traces, or transmission lines.

Figure 5:
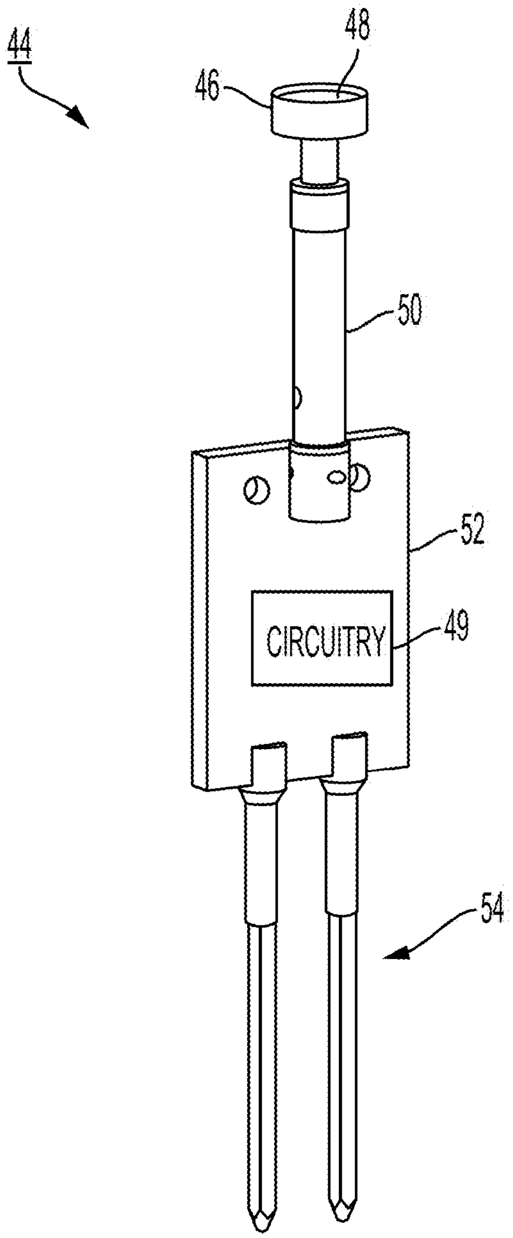
FIG. 5 is a drawing of a perspective view of an example sensor.

FIG. 5 shows another example implementation of a sensor, such as sensor 22 or 22*a*, which is labeled sensor 44. In this example, sensor 44 include a head 46 having a surface 48 for wirelessly coupling to one or more sensor pads. Head 46 may include a shroud like shroud 40 of FIG. 4. Surface 48 may be an implementation of surface 38 of FIG. 4. Sensor 44 also includes a coaxial conduit 50 for transmitting electrical signals resulting from the wireless coupling. Coaxial conduit 50 is connected to a substrate 52, which may contain circuitry 49 for amplifying, filtering, and/or otherwise processing received electrical signals, as described with respect to FIG. 1 below. In some implementations, circuitry 49 may be an amplifier like amplifier 79*a* described below. In this example, an electrical signal may be converted, by the circuitry, into a differential signal. Accordingly, sensor 44 includes two electrical outputs 54, each to output a component of the differential signal. The electrical outputs may be wire-wrapped to corresponding electrical connections. An example differential signal transmits information using two complementary signals, which are two signals that are 180° out of phase of each other. Although a differential signal contains two component signals, a differential signal is referred to as "an electrical signal" in accordance with convention, since the two signals taken together are used to transmit a single block of information.

A sensor, such as sensor 36 or sensor 44, is configured to wirelessly couple to one or more of the sensor pads, such as sensor pad 14, on circuit board 10 when fixture 18 is brought into proximity of the circuit board during testing. In this regard, wireless coupling, which is also known as electrostatic or capacitive coupling, enables electrical signals or electrical energy to be transferred wirelessly from one conductor to another conductor. In this example, signals are transferred wirelessly from a sensor pad (e.g., 14 of FIG. 1) of the circuit board to sensor 22. The sensor is configured to receive, through the wireless coupling, an electrical response that is based on the electrical signal being applied to test pad (e.g., 12 of FIG. 1) via pin assembly 20. The electrical signal that pin assembly 20 applies to the test pad 12 travels through conductive trace 16 to the sensor pad 14. Sensor 22, such as sensor 36 or 44, which is wirelessly coupled to the sensor pad 14 receives, by way of this wireless coupling, an electrical response from sensor pad 14 that is based on the electrical signal applied by pin assembly 20 to the test pad 12. The electrical response manifests as an electrical signal, such as an AC electrical signal (e.g., AC current), on sensor 22.

In this regard, in some implementations, a single electrical path through the circuit board is tested at a time. Accordingly, even though a sensor 22 covers more than one sensor pad (e.g., 14 and 14*a*), a signal obtained by sensor 36 through wireless coupling can be attributed to the sensor pad of the electrical path known to be under test. That is, the test system knows which conductive pads connect to which paths on the circuit board. Knowing this and testing one electrical path at a time enables the test system to determine the sensor pad that is emitting a signal during testing. In some implementations, multiple electrical paths may be tested at the same time, for example if two or more electrical paths are not electrically connected and the sensor pads therefor are not covered by the same sensor. In the example of FIG. 1, electrical paths 16 and 16*a* met these criteria for concurrent testing.

Referring to FIG. 1, fixture 18 is part of a test system 60 that may include one or more of the following circuits: a signal source 62, a multiplexer circuit 64, a filter circuit 66, a gain circuit 68, a detector 70, and test instrument(s)/control system 72. Examples of test instrument(s)/control system 72 are described below with respect to FIG. 9.

Signal source 62 is configured to apply electrical signals, such as AC signals, to one or more pins of the fixture. In some implementations, one or more switches 68 are controllable to selectively apply electrical signals to one or more of the pins. The switches may be controlled by test instrument(s)/control system 72. An example of a switch is a transistor or a microelectromechanical (MEM) device.

In this example, each sensor, such as sensors 22 and 22*a*, is electrically connected to circuitry 76, which includes multiplexer circuit 64, filter circuit 66, and gain circuit 68 in this implementation. For example, sensor 22 may be connected to a conductive path 78*a* (e.g., via coaxial conduit 47), which also connects to circuitry 76. The conductive path may include one more wires, such as coaxial cables or twisted pairs, one or conductive traces, and/or other conductive media with or without electronic components such as a low-noise active buffer to hold a signal from sensor 22.

Each conductive path, such as conductive paths 78*a*, 78*b*, may each include an amplifier, such as amplifiers 79*a*, 79*b*. Each amplifier may be an operational amplifier. Each amplifier is electrically connected to circuitry 76 and to a respective sensor via a respective conductive path. For example, amplifier 79*a* is electrically connected to circuitry 76 and sensor 22. Each amplifier is configured to receive signal(s) from a respective sensor and to amplify those signal(s)—for example, to increase the amplitude of the signal(s)—prior to passing those signals to circuitry 76. Each amplifier may be electromagnetically shielded to inhibit, to reduce, and/or to prevent unwanted wireless coupling of signals between the amplifier(s) and conductive structures such as conductive trace(s) and/or conductive pads on the circuit board. The electromagnetic shielding may include metal surrounding the amplifier, with a dielectric, which may be air or other material, between the metal and the amplifier.

In some implementations, a respective sensor and amplifier may be integrated into a component referred to herein as a sensor package. For example, amplifier 79*a* and sensor 22 may be parts of a single sensor package. For example, amplifier 79*b* and sensor 22*a* may be parts of a single sensor package, which is different from the sensor package containing amplifier 79*a* and sensor 22. In some implementations, sensor 44 of FIG. 5 may be considered to be a sensor package.

In some implementations, each sensor package may be electromagnetically shielded to inhibit, to reduce, and/or to prevent unwanted wireless electrical signal coupling between its sensor and amplifier and other electrically conductive structures such as, but not limited to, pins, such as pin 28, of a pin assembly 20, 20*a*, other conductive pads of the circuit board not coupled to the sensor, conductive traces of the circuit board, and conductive structures on fixture 18. The electromagnetic shielding may include metal surrounding at least part of the sensor and the amplifier, with a dielectric, which may be air or other material, adjacent to the shielding metal.

In another example, referring to FIG. 3, shroud 40 and conduit 47 may be surrounded by metal with a dielectric shroud between them, which constitutes electromagnetic shielding, to inhibit, to reduce, and/or to prevent unwanted wireless coupling of the sensor to other structures on the circuit board, but that electromagnetic shielding may not extend over surface 38 that is intended to wirelessly couple to the sensor pads. That is, the surface of each sensor, such as surface 38 of sensor 36 (FIG. 3) still is configured to wirelessly couple to the sensor pads as described herein.

In some implementations, each amplifier, each sensor, each sensor package, and/or each pin/pin assembly on a fixture such as fixture 18 is electromagnetically shielded. In some implementations, one or more of these components need not be electromagnetically shielded. For example, a pin or pin assembly may be electromagnetically shielded but a sensor or sensor package may not be electromagnetically shielded. For example, a sensor or sensor package may be electromagnetically shielded but a pin or pin assembly may not be electromagnetically shielded.

Multiplexer circuit 64 may be electrically connected to more than one sensor such as sensor 22 and sensor 22*a* via respective conductive paths. Although a single multiplexer is pictured, multiplexer circuit 64 includes one or more multiplexers configured to select an output signal from a connected sensor (a "sensor signal"), such as sensors 22 or 22*a*, and to pass the selected signal to filter circuit 66. The multiplexer(s) may be controlled by test instrument(s)/control system 72.

Although a single filter is pictured, filter circuit 66 includes one or more filters configured to remove noise from a sensor signal selected by multiplexer circuit 64. The output of filter circuit 66 is referred to as a filtered sensor signal.

Gain circuit 68 may include one or more amplifiers, such as operational amplifiers, configured to increase the amplitude or strength of a filtered sensor signal. The output of gain circuit 68 is referred to as an amplified sensor signal.

A detector 70, an example of which is a stand-alone AC signal detector, is configured to compare the amplified sensor signal to one or more predefined thresholds. In some implementations, detector 70 may be implemented by circuitry, such as one or more processing devices or logic, examples of which are described herein, in a test instrument and/or control system that is part of the test system.

In some implementations, detector 70 may be programmed with multiple thresholds, for example two thresholds, for comparison. The thresholds may be set based on the attributes of the electrical signals applied by the pins. In some examples, for greater amplitude signals, higher thresholds may be set, whereas for lower amplitude signals, lower thresholds may be set. Test instrument(s)/control system 72 may be configured to program detector 70 with the thresholds.

The first threshold may be for detecting that a sensor pad has received a signal applied by a pin to a test pad. The second threshold may be for detecting a short circuit in an electrical path under test, as described in the following examples.

If the amplitude of an amplified sensor signal is above the first threshold but below the second threshold, then the test system—for example, the control system and/or a test instrument of the type described herein—determines that an electrical path, including, e.g., test pad 12, sensor pad 14, and a conductive trace 16 electrically connecting test pad 12 and sensor pad 14, has passed testing. That is, if the amplitude of the amplified sensor signal is above the first threshold but below the second threshold, this means that amplified sensor signal has attributes, such as amplitude or strength, which are what would be expected in response to application of the electrical signal to test pad 12 and travel of the electrical signal through conductive trace 16.

If the amplitude of the amplified sensor signal is above the first threshold and also above the second threshold, then the test system determines that there is a short circuit in the electrical path including, e.g., test pad 12, sensor pad 14, and a conductive trace 16 electrically connecting test pad 12 and sensor pad 14. This short circuit causes multiple sensor pads to wirelessly couple to the sensor, causing an unexpectedly high amplitude or strength of the signal appearing on the sensor. The location of the short circuit is not known, but its existence is determined by an unexpectedly high amplitude or strength of the amplified sensor signal. In this instance, the test system determines that the electrical path, and thus the circuit board, has not passed testing.

If the amplitude of the amplified sensor signal is below the first threshold, and therefore also below the second threshold, then the test system determines that there is a discontinuity in the electrical path, such as a break, disruption, or unexpected impedance in the electrical path. The discontinuity prevents the full signal traveling through the conductive trace 16 from reaching sensor pad 14, thereby causing an unexpectedly low, or zero, amplitude or strength of the signal on the sensor. The location of the discontinuity is not known, but its existence is determined by the unexpectedly low amplitude or strength of the amplified sensor signal. In this instance, the test system determines that the electrical path, and thus the circuit board, has not passed testing.

Figure 8:
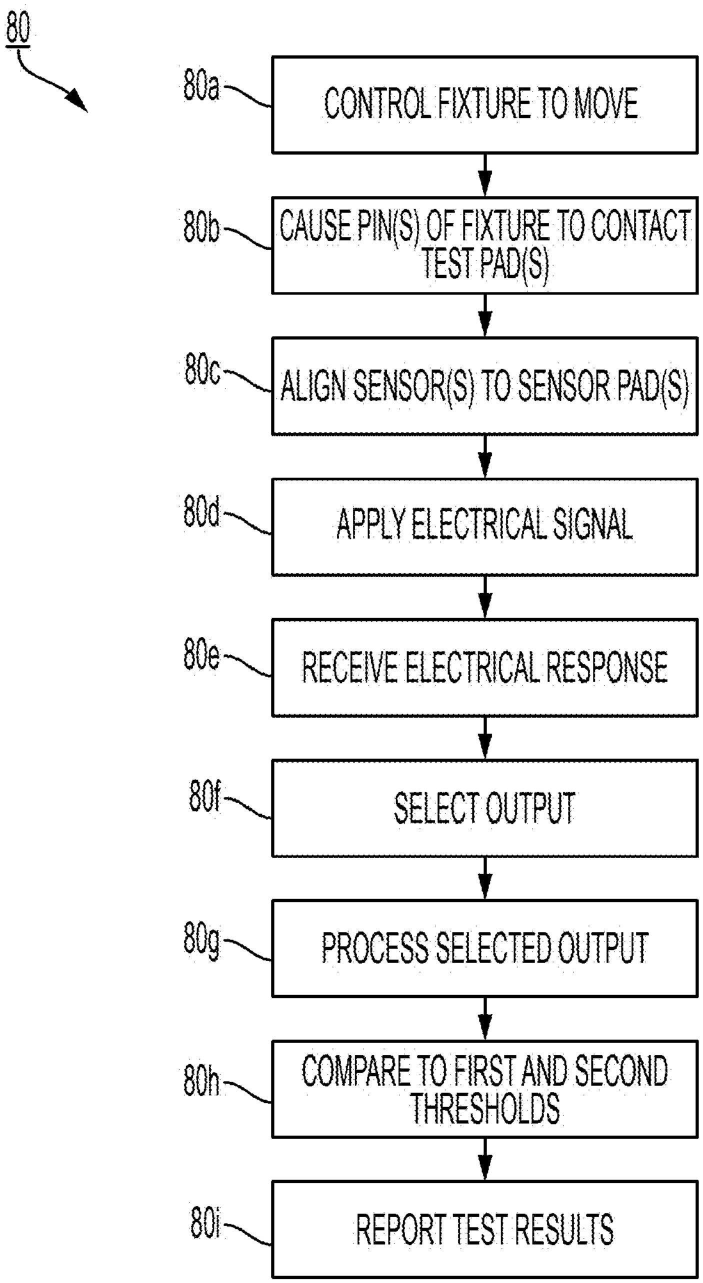
FIG. 8 is a flowchart showing example operations included in an example process for testing electrical paths on and/or through a circuit board.

FIG. 8 is a flowchart showing example operations included in an example process for testing electrical path(s) on an exterior of and/or through an interior of a circuit board using a fixture such as fixture 18 of FIG. 1. The operations of FIG. 8 are described with respect to the implementation of FIG. 1; however, they may be used with different implementations of fixture 18 and circuit board 10.

Process 80 includes controlling (80*a*) fixture 18 to move into proximity of circuit board 10 under test. For example, fixture 18 may be moved in the direction of arrows 24, 26 so that fixture 18 is substantially parallel to circuit board 10. In some implementations, substantially parallel may include a 5% deviation or less from completely parallel, a 10% deviation or less from completely parallel, a 15% deviation or less from completely parallel, a 20% deviation or less from completely parallel, or a 25% deviation or less from completely parallel.

Operation 80*a* may be performed using robotics to move fixture 18 relative to circuit board 10 for testing knowing the Cartesian X,Y coordinates of both the fixture and the circuit board. The robotics may be controlled by test instrument(s) and/or a control system such as those described herein. The fixture may be moved manually relative to the circuit board for testing. The fixture may be moved relative to the circuit board for testing through a combination of robotic and manual movements.

This movement causes (80_b_) one or more pins of pins assemblies, such as pin assembly 20, of fixture 18 to physically contact respective test pad(s), such as test pad 12, on the circuit board, thereby creating electrical connection(s) between respective pin(s) and test pad(s). The movement also aligns (80_c_) one or more sensor(s), such as sensor 22, of the fixture to respective sensor pad(s), such as sensor pad 14, on the circuit board and brings one or more sensor(s) to within physical proximity of the respective sensor pad(s), e.g., within single-digit millimeters, double-digit millimeters, or single-digit centimeters of the respective sensor pad(s). The physical proximity of the sensor(s) to the sensor pad(s) enables wireless coupling of the type described herein between the sensor(s) to the sensor pad(s) when there is an electrical signal on the sensor pad(s).

Process 80 includes applying (80_d_) an electrical signal from a pin, such as pin 28/pin assembly 20 (see also FIG. 2), to a corresponding test pad, such as test pad 12. Referring to FIG. 1, this may be done by the test instrument(s) and/or a control system controlling a signal source 62 to output a signal and controlling one or more of the switches 68 to direct that signal to the appropriate pin/pin assembly. Process 80 includes receiving (80_e_), at a sensor such as sensor 22, an electrical response through the wireless coupling between the sensor 22 and the sensor pad 14. Since the conductive path to sensor pad 14 is being tested in this example, all other sensor pads covered by sensor 22 including, but not limited to, sensor pad 14_a_, may be guarded to prevent readings by sensor 22 from those other sensor pads.

In this regard, guarding refers to electrically connecting conductive structures adjacent to the sensor pads and/or electrical paths under test to a common return, such as electrical ground or a DC voltage. For example, sensor pads adjacent to sensor pads and/or electrical paths under test may be electrically connected to a common return. The control system described herein may configure switches (not shown) to connect the sensor pads adjacent to sensor pads and/or electrical paths under test to the common return. Guarding may limit the effect of the stray capacitance on the sensor pads and/or electrical paths under test. In some implementations, a guard plate or ground plane is included on fixture 18 to further isolate stray capacitance from the sensor amplifiers, sensor, and test fixture wiring. The guard plate or ground plane may be made of metal, such as copper. This guard plate or ground plane may be connected to the common return signal to guard against additional stray capacitance coupling. The guard plate or ground plane can be mounted within or on the fixture near to surface 18_a_ or 18_b_ of fixture 18, for example. If mounted on or near the surface 18_a_ of the fixture, the guard plate or ground plane may be insulated by a thin layer of electrically insulating material.

The electrical response received at sensor 22 is based on the applied (80_d_) electrical signal passing through a conductive trace such as conductive trace 16 on the circuit board and arriving at sensor pad 14. The electrical response may manifest on the conductive portion of the sensor, which includes the surface such as surface 38 of FIG. 4, as electrical energy such as electrical current through the sensor.

Process 80 includes selecting (80_f_) an output of the sensor that is based on the electrical response. The output of the sensor may be amplified by an amplifier. The output of the sensor may be the electrical current in the sensor or a signal based thereon, such as a processed signal or a differential signal. The selecting operation may be performed by test instrument(s) and/or a control system controlling a multiplexer in multiplexer circuit 64 to select the electrical response from the sensor.

Process 80 includes processing (80_g_) the output from sensor to produce an amplified signal that is based on the electrical response. The processing may optionally be performed by filter circuit 66 and amplifier gain circuit 68, which may operate as described above. If processing is performed on the sensor itself—e.g., using circuitry 49 included on substrate 52 (e.g., FIG. 5)—operation 80_g_ may be omitted in some examples.

Process 80 includes comparing (80_h_) the amplified signal to a first threshold and comparing the amplified signal to a second threshold, where the first and second thresholds are for the same signal attribute such as signal amplitude or strength, and where the second threshold is greater than the first threshold. These comparisons may be performed by detector 70 or by the test instrument(s) or control system. The test instrument(s) or control system may use these comparisons to determine whether the circuit board, or a portion thereof, passed or failed testing and, in some cases, to diagnose a problem with the circuit board. As also explained above, in an example, if the amplitude of the amplified sensor signal is above the first threshold but below the second threshold, then the test system determines that an electrical path, such as test pad 12, sensor pad 14, and a conductive trace 16 electrically connecting test pad 12 and sensor pad 14 has passed testing. If the amplitude of the amplified sensor signal is above the first threshold and also above the second threshold, then the test system determines that there is a short circuit in the electrical path such as test pad 12, sensor pad 14, and a conductive trace 16 electrically connecting test pad 12 and sensor pad 14. In that case, the circuit board has failed testing. If the amplitude of the amplified sensor signal is below the first threshold, and therefore also below the second threshold, then the test system determines that there is a discontinuity in the electrical path, such as a break, disruption, or unexpected impedance in the electrical path. In that case, the circuit board has failed testing.

Process 80 includes reporting (80_i_) test results. For example, the report may be graphic and/or textual and identify conductive pads and/or electrical pathways on the circuit board that passed and/or failed testing. The report may also indicate expected reasons for failure, such as a short circuit or a discontinuity.

Process 80 may be performed for an a completely internal trace or layer, such as conductive trace 16_c_, which may be an antenna or part of an antenna embedded in the circuit board. As noted, the control system may know the layout of the circuit board prior to testing, including the locations of any inner conductive traces, layers, antennas, or the like that require testing. In this case, process 80 may include applying (80_d_) an electrical signal from a pin, such as pin 28/pin assembly 20_a_ (see also FIG. 2), to a corresponding test pad, such as test pad 12_a_. In some implementations, the electrical signal passes through one or more layers of circuit board 10 along line 15 to reach conductive trace 16_c_. In some implementations, test pad 12_a_ extends deep into the circuit board (e.g., test pad is, or includes, a conductive via) as shown, and the electrical signal passes through sensor pad 12*a* to conductive trace 16. In this example, sensor pads 14*b*, 14*d*, and 14*e* are guarded so that sensor 22 obtains an electrical response from only internal sensor pad 14*c*. This electrical signal produces an electrical response in internal sensor pad 14*c*, as described above. The remaining operations of process are similar to those described above.

Figure 9:
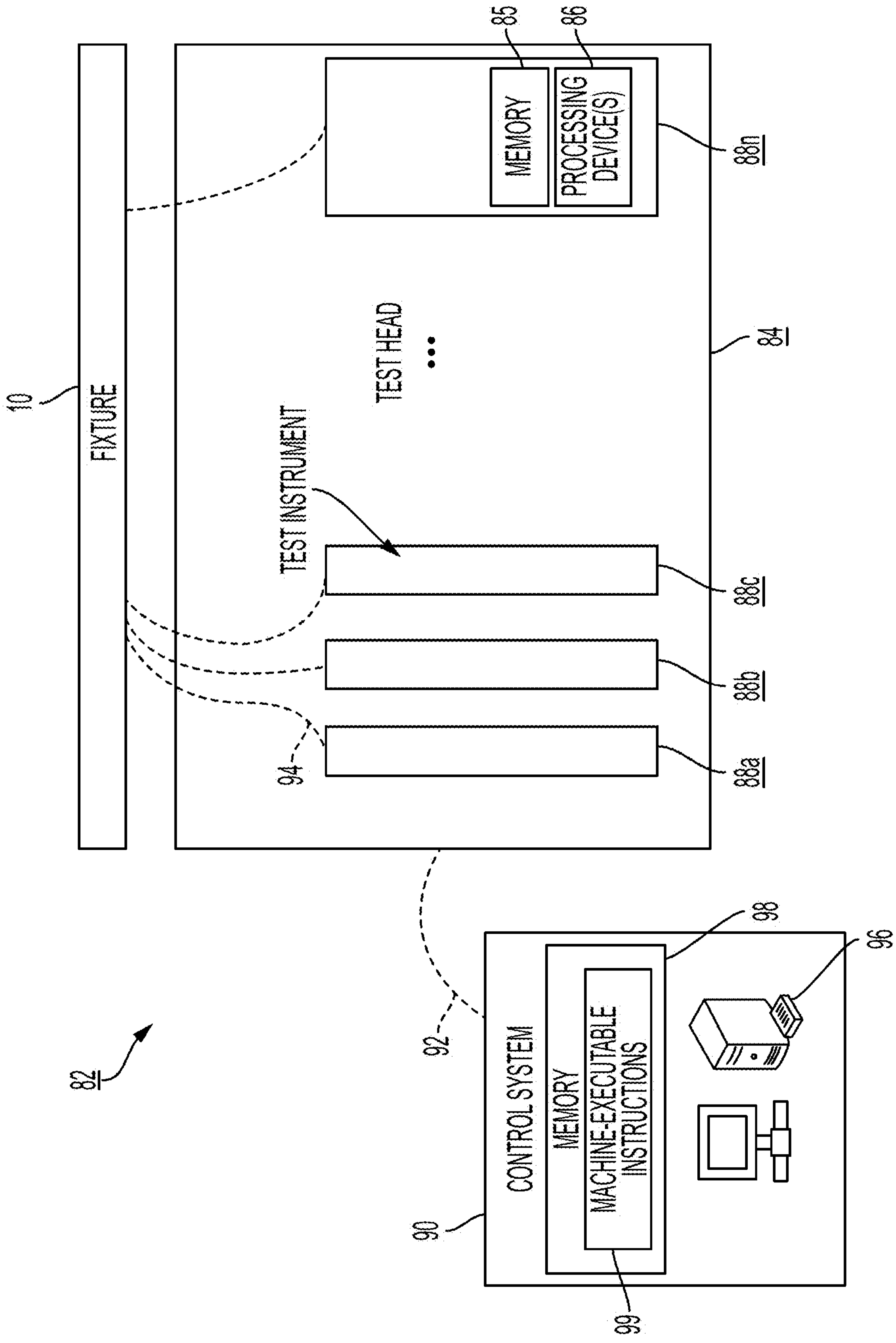
FIG. 9 is a block diagram of example test equipment with which the example devices, systems, circuits, and processes described herein may be implemented.

FIG. 9 is a block diagram showing example components of example ATE 82 that may be used to implement all or part of test system 60 of FIG. 1. ATE 82 includes a test head 84, which may be in wired or wireless communication with fixture 18.

In this example, test head 84 includes test instruments 88*a* to 88*n* (where n>3), each of which may be configured, as appropriate, to implement circuit board testing as described herein and/or other functions. Although only four test instruments are shown, ATE 82 may include any appropriate number of test instruments, including one or more residing outside of test head 84. The test instruments may be hardware devices that each may include memory 85 and one or more processing devices 86 and/or other circuitry (not shown). The memory and processing devices are illustrated only on test instrument 88*n*. The test instruments may be configured—for example, programmed—to receive and to process test signals such as amplified signals that are based on the electrical signals received by sensors, such as sensor 22 of FIG. 1, through wireless coupling with circuit board sensor pads, such as sensor pad 14. The test instruments may be configured—for example, programmed—to receive and to process test signals such as signals from a stand-alone AC detector 70 that are produced as a result of comparison of the amplified signals to one or two thresholds, as described above. The test instrument may determine, based on these signals, whether a conductive trace, such as conductive trace 16, on a circuit board passed or failed testing. In some implementations, circuitry 76 and AC detector 70 of FIG. 1 may be implemented on (e.g., may be part of) one or more test instruments and/or a control system.

In an example, the one or more processing devices on a test instrument 88*a* to 88*n* may execute instructions to compare the amplified signals received from circuitry, such as gain circuit 68, to first and second thresholds as described above and to determine, based on the comparison, whether a corresponding circuit board passed for failed testing and why that circuit board passed or failed testing, e.g., due to discontinuity or short circuit. For example, the one or more processing devices on a test instrument 88*a* to 88*n* may receive signals from an AC detector, such as detector 70, that are based on comparison of the amplified signals to first and second thresholds performed by the AC detector and determine, based on those signals, whether a corresponding circuit board passed for failed testing and why that circuit board passed or failed testing, e.g., due to discontinuity or short circuit. In some implementations, circuitry 76 and AC detector 70 of FIG. 1 may be implemented on a single test instrument or on or across multiple test instruments.

Communications between the test instruments 88*a* to 88*n* and a fixture, such as fixture 10, may be over one or more test channels 94. The test channels may include wired and/or wireless communication media.

In some implementations, control signals to implement the controls described herein may be generated by test program(s) executing on a test instrument.

Control system 90 may be configured—e.g., programmed—to communicate with test instruments 88*a* to 88*n* to direct and/or to control testing of DUTs, such as, but not limited to, circuit board 10. In some implementations, this communication 92 may be over a computer network or via a direct connection such as a computer bus or an optical medium. In some implementations, the computer network may be or include a local area network (LAN) or a wide area network (WAN).

The control system may be or include a computing system comprised of one or more processing devices 96 (e.g., microprocessor(s)) and memory 98 for storing machine-executable instructions 99 to execute to control operation of the ATE and/or testing, and/or one or more test programs to execute and/or to send to the test instruments for execution. Control system 90 may also be configured to receive and to process and/or analyze received signals. For example, the one or more processing devices 96 may execute instructions to compare the amplified signals from circuitry, such as gain circuit 68, to first and second thresholds as described above and determine, based on the comparison, whether a corresponding circuit board passed for failed testing and why that circuit board passed or failed testing, e.g., due to discontinuity or short circuit. For example, the one or more processing devices 96 may receive signals from an AC detector, such as detector 70, that are based on comparison of the amplified signals to first and second thresholds performed by the AC detector and determine, based on those signals, whether a corresponding circuit board passed for failed testing and why that circuit board passed or failed testing, e.g., due to discontinuity or short circuit. In some implementations, circuitry 76 and AC detector 70 of FIG. 1 may be implemented on the control system. In some implementations, circuitry 76 and AC detector 70 of FIG. 1 may be implemented on the control system in combination with one or more of the test instruments.

In some implementations, the control functionality of the control system is centralized in processing device(s) 96. In some implementations, all or part of the control functionality attributed to control system 90 may also or instead be implemented on one or more test instruments and/or all or part of the testing functionality attributed to one or more test instruments may also or instead be implemented on control system 90. For example, the control system may be distributed across processing device(s) 96 and one or more of test instruments 88*a* to 88*n*.

All or part of the systems and processes described herein including but not limited to process 80 and variants thereof may be configured and/or controlled at least in part by one or more computers using one or more computer programs tangibly embodied in one or more information carriers, such as in one or more non-transitory machine-readable storage media. A computer program can be written in any form of programming language, including compiled or interpreted languages, and it can be deployed in any form, including as a stand-alone program or as a module, part, subroutine, or other unit suitable for use in a computing environment. A computer program can be deployed to be executed on one computer or on multiple computers at one site or distributed across multiple sites and interconnected.

Actions associated with configuring or controlling the test system and processes described herein can be performed by one or more programmable processors executing one or more computer programs to control or to perform all or some of the operations described herein. All or part of the test systems and processes can be configured or controlled by special purpose logic circuitry, such as, an FPGA (field programmable gate array) and/or an ASIC (application-specific integrated circuit) or embedded microprocessor(s) localized to the instrument hardware.

Processors suitable for the execution of a computer program include, by way of example, both general and special purpose microprocessors, and any one or more processors of any kind of digital computer. Generally, a processor will receive instructions and data from a read-only storage area or a random access storage area or both. Elements of a computer include one or more processors for executing instructions and one or more storage area devices for storing instructions and data. Generally, a computer will also include, or be operatively coupled to receive data from, or transfer data to, or both, one or more machine-readable storage media, such as mass storage devices for storing data, such as magnetic, magneto-optical disks, or optical disks. Non-transitory machine-readable storage media suitable for embodying computer program instructions and data include all forms of non-volatile storage area, including by way of example, semiconductor storage area devices, such as EPROM (erasable programmable read-only memory), EEPROM (electrically erasable programmable read-only memory), and flash storage area devices; magnetic disks, such as internal hard disks or removable disks; magneto-optical disks; and CD-ROM (compact disc read-only memory) and DVD-ROM (digital versatile disc read-only memory).

As used herein, the terms "comprises," "comprising," "includes," "including," "has," "having," "contains," "containing," and any variations thereof, are intended to cover a non-exclusive inclusion, such that systems, techniques, apparatus, structures, processes, or other subject matter described or claimed herein that includes, has, or contains an element or list of elements does not include only those elements but can include other elements not expressly listed or inherent to such systems, techniques, apparatus, structures, processes or other subject matter described or claimed herein.

All examples described herein are non-limiting.

In the description and claims provided herein, the adjectives "first", "second", "third", and the like do not designate priority or order unless context suggests otherwise. Instead, these adjectives may be used solely to differentiate the nouns that they modify.

Any mechanical or electrical connection herein may include a direct physical connection or an indirect physical connection that includes one or more intervening devices unless context suggests otherwise. A connection between two electrically conductive devices includes an electrical connection unless context suggests otherwise. The signals described herein are electrical signals unless context suggests otherwise.

"Conductive" as used herein refers to electrically conductive unless context suggests otherwise.

Elements of different implementations described may be combined to form other implementations not specifically set forth previously. Elements may be left out of the systems described previously without adversely affecting their operation or the operation of the system in general. Furthermore, various separate elements may be combined into one or more individual elements to perform the functions described in this specification.

Other implementations not specifically described in this specification are also within the scope of the following claims.

What is claimed is:

1. A system for testing an electrical connection in a circuit board, the circuit board comprising a first electrically-conductive structure for receiving test signals, second electrically-conductive structures for mounting components, and electrically-conductive traces between the first electrically-conductive structure and the second electrically-conductive structures, the system comprising:

a pin assembly comprising an electrically-conductive pin that is configured to physically contact the first electrically-conductive structure to apply an electrical signal to the first electrically-conductive structure; and a sensor configured to wirelessly couple to a second electrically-conductive structure of the second electrically-conductive structures, the sensor being configured to receive, through the wireless coupling, an electrical response that is based on the electrical signal through an electrically-conductive trace of the electrically-conductive traces on the circuit board;

wherein the first electrically conductive structure is different from the second electrically conductive structure and wherein the electrically conductive trace electrically connects the first electrically conductive structure and the second electrically conductive structure.

2. The system of claim 1, further comprising a sensor package, the sensor package comprising the sensor and an amplifier, the amplifier being configured to amplify a signal that is based on the electrical response.

3. The system of claim 2, wherein the sensor package is electromagnetically shielded.

4. The system of claim 1, wherein the sensor is electromagnetically shielded.

5. The system of claim 1, wherein the pin assembly comprises electromagnetic shielding to electromagnetically shield the electrically-conductive pin.

6. The system of claim 1, wherein the electrical response is received from the second electrically-conductive structure; and wherein the electrically-conductive trace is internal to the circuit board or on a surface of the circuit board.

7. The system of claim 1, wherein the sensor comprises an electrical insulator that surrounds at least part of the sensor.

8. The system of claim 1, further comprising:

circuitry configured to receive a signal based on the electrical response from the sensor and to amplify the signal based on the electrical response to produce an amplified electrical signal.

9. The system of claim 8, further comprising:

a detector configured to compare a signal based on the amplified electrical signal to a first threshold to test the electrically-conductive trace.

10. The system of claim 9, wherein, if the signal based on the amplified electrical signal exceeds the first threshold, then the one or more processing devices determine that an electrical path including the electrically-conductive trace has passed testing.

11. The system of claim 9, wherein the detector is configured also to compare the signal based on the amplified electrical signal to a second threshold, the second threshold being greater than the first threshold.

12. The system of claim 1, further comprising:

a fixture containing the electrically-conductive pin and the sensor, the fixture being configured for placement relative to the circuit board so that the electrically-conductive pin aligns to the first electrically-conductive structure and the sensor aligns to multiple instances of the second electrically-conductive structures.

13. The system of claim 12, wherein alignment of the electrically-conductive pin to the first electrically-conductive structure and of the sensor to the multiple ones instances of the second electrically-conductive structures is based on coordinate locations of the first electrically-conductive structure and the multiple instances of the second electrically-conductive structure.

14. The system of claim 1, wherein the second electrically-conductive structure is internal to the circuit board.

15. The system of claim 1, wherein the second electrically-conductive structure is on a surface of the circuit board.

16. The system of claim 1, wherein the second electrically-conductive structure comprises a component structure, a via structure, a test structure, an electrical routing trace, an inner layer trace, or a metal surface area internal or external to the circuit board.

17. A system for testing an electrical connection in a circuit board, the circuit board comprising a first electrically-conductive structure for receiving test signals, second electrically-conductive structures for mounting components, and electrically-conductive traces between the first electrically-conductive structure and the second electrically-conductive structures, the system comprising:

a pin assembly comprising an electrically-conductive pin that is configured to physically contact the first electrically-conductive structure to apply an electrical signal to the first electrically-conductive structure; and a sensor configured to wirelessly couple to a second electrically-conductive structure of the second electrically-conductive structures, the sensor being configured to receive, through the wireless coupling, an electrical response that is based on the electrical signal through an electrically-conductive trace of the electrically-conductive traces on the circuit board;

wherein the pin assembly comprises an outer enclosure, the outer enclosure comprising an electrically-insulating ring, the outer enclosure being configured to move relative to the electrically-conductive pin so that the outer enclosure encloses the electrically-conductive pin when the electrically-conductive pin is in physical contact with the first electrically-conductive structure, the outer enclosure comprising metal.

18. The system of claim 17, wherein the outer enclosure is spring-loaded to move relative to the electrically-conductive pin; and wherein the outer enclosure is configured at least to inhibit signal coupling between the electrically-conductive pin and the sensor.

19. A system for testing an electrical connection in a circuit board, the circuit board comprising a first electrically-conductive structure for receiving test signals, second electrically-conductive structures for mounting components, and electrically-conductive traces between the first electrically-conductive structure and the second electrically-conductive structures, the system comprising:

a pin assembly comprising an electrically-conductive pin that is configured to physically contact the first electrically-conductive structure to apply an electrical signal to the first electrically-conductive structure;

a sensor configured to wirelessly couple to a second electrically-conductive structure of the second electrically-conductive structures, the sensor being configured to receive, through the wireless coupling, an electrical response that is based on the electrical signal through an electrically-conductive trace of the electrically-conductive traces on the circuit board;

circuitry configured to receive a signal based on the electrical response from the sensor and to amplify the signal based on the electrical response to produce an amplified electrical signal; and a detector configured to compare a signal based on the amplified electrical signal to a first threshold to test the electrically-conductive trace;

wherein, if the signal based on the amplified electrical signal exceeds the first threshold but not a second threshold, then an electrical path including the electrically-conductive trace has passed testing; and wherein if the signal based on the amplified electrical signal exceeds the second threshold, then there is a short circuit to a second electrically-conductive structure.

20. A system for testing an electrical connection in a circuit board, the circuit board comprising a first electrically-conductive structure for receiving test signals, second electrically-conductive structures for mounting components, and electrically-conductive traces between the first electrically-conductive structure and the second electrically-conductive structures, the system comprising:

a pin assembly comprising an electrically-conductive pin that is configured to physically contact the first electrically-conductive structure to apply an electrical signal to the first electrically-conductive structure; and a sensor configured to wirelessly couple to a second electrically-conductive structure of the second electrically-conductive structures, the sensor being configured to receive, through the wireless coupling, an electrical response that is based on the electrical signal through an electrically-conductive trace of the electrically-conductive traces on the circuit board;

wherein the circuit board comprises multiple instances of the first electrically-conductive structure, and wherein the circuit board comprises multiple sets of second electrically-conductive structures, each set of second electrically-conductive structures being electrically connected to a respective instance of the first electrically-conductive structure through electrically-conductive traces; and wherein the system comprises:

multiple instances of the sensor, each instance of the sensor being configured to wirelessly couple to a second electrically-conductive structure in a different set of the second electrically-conductive structures;

a multiplexer to select an output of one of the instances of the sensor; and a detector to receive a signal that is based on the output of the one of the instances of the sensor.

21. A method of testing an electrical connection in a circuit board, the circuit board comprising a first electrically-conductive structure for receiving test signals, second electrically-conductive structures for mounting components, and electrically-conductive traces between the first electrically-conductive structure and the second electrically-conductive structures, the method comprising:

causing an electrically-conductive pin to physically contact the first electrically-conductive structures;

wirelessly coupling a sensor to a second electrically-conductive structure of the second electrically-conductive structures;

applying an electrical signal to the first electrically-conductive structure; and receiving, at the sensor through the wireless coupling, an electrical response that is based on the electrical signal through an electrically-conductive trace of the electrically-conductive traces on the circuit board between the first electrically-conductive structure and the second electrically-conductive structure;

wherein the first electrically conductive structure is different from the second electrically conductive structure and wherein the electrically conductive trace electrically connects the first electrically conductive structure and the second electrically conductive structure.

22. The method of claim 21, further comprising:

selecting an output of the sensor that is based on the electrical response;

processing the output to produce a signal that is based on the electrical response; and comparing the signal that is based on the electrical response to a first threshold.

23. The method of claim 22, wherein processing the output comprises amplifying a precursor signal to the signal that is based on the electrical response.

24. The method of claim 22, further comprising:

comparing the signal that is based on the electrical response to a second threshold.

25. The method of claim 21, wherein causing the electrically-conductive pin to physically contact the first electrically-conductive structure results in at least partly electromagnetically shielding the electrically-conductive pin.

26. The method of claim 21, wherein causing the electrically-conductive pin to physically contact the first electrically-conductive structure comprise bringing a fixture comprising the electrically-conductive pin and the sensor into at least partial contact with the circuit board.

27. The method of claim 26, wherein bringing the fixture into at least partial contact is based on coordinates associated with at least one of the fixture or the circuit board.

28. The method of claim 21, wherein at least one of the electrically-conductive pin or the sensor is electromagnetically shielded.

29. A method of testing an electrical connection in a circuit board, the circuit board comprising a first electrically-conductive structure for receiving test signals, second electrically-conductive structures for mounting components, and electrically-conductive traces between the first electrically-conductive structure and the second electrically-conductive structures, the method comprising:

causing an electrically-conductive pin to physically contact the first electrically-conductive structure;

wirelessly coupling a sensor to a second electrically-conductive structure of the second electrically-conductive structures;

applying an electrical signal to the first electrically-conductive structure;

receiving, at the sensor through the wireless coupling, an electrical response that is based on the electrical signal through an electrically-conductive trace of the electrically-conductive traces on the circuit board between the first electrically-conductive structure and the second electrically-conductive structure, selecting an output of the sensor that is based on the electrical response;

processing the output to produce a signal that is based on the electrical response;

comparing the signal that is based on the electrical response to a first threshold; and comparing the signal that is based on the electrical response to a second threshold;

wherein, if the signal exceeds the first threshold but not the second threshold, then an electrical path including the electrically-conductive trace has passed testing; and wherein if the signal exceeds the second threshold, then it is determined that there is a short circuit to a second electrically-conductive structure.

* * * * *